United States Patent
Elkins

(10) Patent No.: US 7,345,875 B2
(45) Date of Patent: Mar. 18, 2008

(54) ELECTROMAGNET-ASSISTED VENTILATION COVER FOR AN ELECTRONIC EQUIPMENT ENCLOSURE

(75) Inventor: Jin Elkins, Opelika, AL (US)

(73) Assignee: Emerson Network Power, Energy Systems, North America, Inc., Warrenville, IL (US)

(*) Notice: Subject to any disclaimer, the term of this patent is extended or adjusted under 35 U.S.C. 154(b) by 38 days.

(21) Appl. No.: 11/273,563

(22) Filed: Nov. 14, 2005

(65) Prior Publication Data

US 2006/0285291 A1 Dec. 21, 2006

Related U.S. Application Data

(60) Provisional application No. 60/692,348, filed on Jun. 20, 2005.

(51) Int. Cl.
*H05K 7/20* (2006.01)
(52) U.S. Cl. .................. 361/695; 361/690; 361/692; 454/184
(58) Field of Classification Search .............. 361/687, 361/690–698, 724–727; 454/184, 338, 341, 454/259; 174/17 VA, 50, 135; 165/80.3, 165/185; 312/223.2, 223.3, 236
See application file for complete search history.

(56) References Cited

U.S. PATENT DOCUMENTS

| | | | | |
|---|---|---|---|---|
| 3,392,654 A | * | 7/1968 | Grenier | 454/75 |
| 4,580,486 A | * | 4/1986 | Schulz | 454/108 |
| 4,715,268 A | * | 12/1987 | Tanner | 454/256 |
| 5,163,870 A | * | 11/1992 | Cooper | 454/184 |
| 5,199,461 A | * | 4/1993 | Carr | 137/625.44 |
| 5,550,558 A | * | 8/1996 | Salam | 345/111 |
| 5,716,271 A | * | 2/1998 | Paidosh | 454/359 |
| 5,793,610 A | * | 8/1998 | Schmitt et al. | 361/695 |
| 5,890,959 A | * | 4/1999 | Pettit et al. | 454/184 |
| 6,000,623 A | * | 12/1999 | Blatti et al. | 236/49.3 |
| 6,005,770 A | * | 12/1999 | Schmitt | 361/695 |
| 6,011,689 A | * | 1/2000 | Wrycraft | 361/695 |
| 6,031,717 A | * | 2/2000 | Baddour et al. | 361/687 |
| 6,181,557 B1 | * | 1/2001 | Gatti | 361/695 |
| 6,527,006 B2 | * | 3/2003 | Jackson | 137/527.6 |
| 6,579,168 B1 | * | 6/2003 | Webster et al. | 454/184 |
| 6,643,130 B1 | * | 11/2003 | DeMarchis et al. | 361/695 |
| 6,676,508 B1 | * | 1/2004 | Graham | 454/270 |
| 6,710,240 B1 | * | 3/2004 | Chen et al. | 174/17 VA |
| 6,732,787 B1 | * | 5/2004 | Trehan et al. | 165/104.33 |
| 6,837,785 B2 | * | 1/2005 | Soderlund | 454/184 |
| 6,927,977 B2 | * | 8/2005 | Singer | 361/695 |
| 6,991,533 B2 | * | 1/2006 | Tsai et al. | 454/184 |
| 7,031,154 B2 | * | 4/2006 | Bash et al. | 361/690 |
| 2002/0130128 A1 | * | 9/2002 | Berglund | 220/230 |

OTHER PUBLICATIONS

The Article "Smoke Damage-Protection for Personal Computers and Workstations", IBM Technical Disclosure Bulletin, Mar. 1993, US vol. 36, Issue 3, pp. 519-522.□□.*

* cited by examiner

Primary Examiner—Michael Datskovskiy
(74) Attorney, Agent, or Firm—Harness, Dickey & Pierce, P.L.C.

(57) ABSTRACT

A ventilation assembly for an electronic equipment enclosure. The ventilation assembly includes a housing having at least one ventilation port, and a cover movable between an open position and a closed position. The cover is positioned over the ventilation port when the cover is in the closed position. The ventilation assembly further includes at least one electromagnet for selectively securing the cover in the closed position.

10 Claims, 2 Drawing Sheets

ELECTROMAGNET-ASSISTED VENTILATION COVER FOR AN ELECTRONIC EQUIPMENT ENCLOSURE

CROSS-REFERENCE TO RELATED APPLICATION

This application claims the benefit of U.S. Provisional Application No. 60/692,348 filed on Jun. 20, 2005. The disclosure of the above application is incorporated herein by reference.

FIELD OF THE INVENTION

The present invention relates to a ventilation assembly for an electronic equipment enclosure.

BACKGROUND OF THE INVENTION

A variety of electronic equipment enclosures (also referred to as cabinets) are available for housing various types of electronic equipment including, for example, telecommunications equipment. Many of these enclosures are provided with one or more exhaust vents for exhausting hot air from within the enclosure using fans or others means. These exhaust vents are commonly provided with electromechanical or pneumatic actuators for opening the exhaust vents when necessary to exhaust hot air from within the enclosure, and for closing the exhaust vents to protect the electronic equipment within the enclosure from the external environment.

As recognized by the inventor hereof, there are several disadvantages to existing exhaust vent actuators, including their relatively high cost and complexity.

SUMMARY OF THE INVENTION

The inventor hereof has succeeded at designing ventilation assemblies for electronic equipment enclosures that do not require expensive actuators and that are relatively simply and inexpensive to implement.

According to one aspect of the present invention, a ventilation assembly for an electronic equipment enclosure includes a housing having at least one ventilation port, and a cover movable between an open position and a closed position. The cover is positioned over the ventilation port when the cover is in the closed position. The ventilation assembly further includes at least one electromagnet for selectively securing the cover in the closed position.

According to another aspect of the present invention, an electronic equipment enclosure includes a housing defining at least one exhaust port, at least one fan positioned in the housing, and a cover movable between an open position and a closed position. The cover is positioned over the exhaust port when the cover is in the closed position. The enclosure further includes at least one electromagnet for selectively securing the cover in the closed position.

According to yet another aspect of the invention, a method for selectively covering an exhaust port of an electronic equipment enclosure having an electromagnet and an exhaust port cover includes energizing the electromagnet to secure the exhaust port cover in a closed position with the exhaust port cover positioned over the exhaust port.

Further aspects of the present invention will be in part apparent and in part pointed out below. It should be understood that various aspects of the invention may be implemented individually or in combination with one another. It should also be understood that the detailed description and drawings, while indicating certain exemplary embodiments of the invention, are intended for purposes of illustration only and should not be construed as limiting the scope of the invention.

BRIEF DESCRIPTION OF THE DRAWINGS

Like reference symbols indicate like elements or features throughout the drawings.

DETAILED DESCRIPTION OF EXEMPLARY EMBODIMENTS

The following description of exemplary embodiments is merely exemplary in nature and is in no way intended to limit the scope of the present invention, its applications, or uses.

Figure 1:
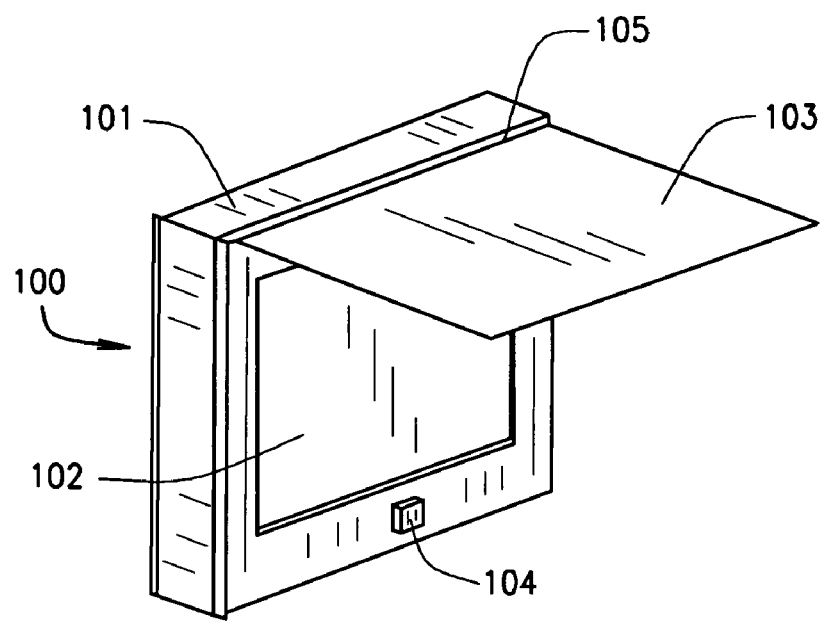
FIG. 1 is a perspective view of a ventilation assembly according to a first exemplary embodiment of the present invention.

A ventilation assembly for an electronic equipment enclosure according to a first exemplary embodiment of the present invention is illustrated in FIG. 1 and indicated generally by reference numeral 100. As shown in FIG. 1, the ventilation assembly 100 includes a housing 101, a ventilation port 102, and a cover 103. The cover is movable between an open position (illustrated generally in FIG. 1) and a closed position. When the cover is in the closed position, the cover is positioned over the ventilation port 102. The ventilation assembly further includes an electromagnet 104 for selectively securing the cover 103 in its closed position.

In the embodiment of FIG. 1, the electromagnet 104 is mounted on a lower center portion of the housing 101. It should be understood, however, that the electromagnet may instead be mounted or otherwise coupled to a different portion of the housing, or to the cover 103, or to any other component in close proximity to the cover when the cover is in the closed position. In this manner, the electromagnet may be energized to selectively secure the cover in the closed position. Additionally, the portion of the ventilation assembly that is in close proximity to the electromagnet (when the cover is in the closed position) is preferably formed of a ferrous material so that the cover is attracted to and/or secured in the closed position when the electromagnet is energized. The position, size, shape, quantity, type and orientation of the electromagnet may be varied as necessary or desired for any given application of the present invention.

With further reference to FIG. 1, the ventilation assembly 100 also includes a hinge 105 for pivotally coupling the cover 103 to the housing 101. In this particular embodiment, the hinge is positioned along a top edge of the cover so that the cover is biased toward its closed position by gravity. However, the position and type of hinge employed may be varied as desired for any specific application. Further, other devices and configurations may be employed for coupling the cover to the housing in such a manner that the cover can move between its open and closed positions. Although the cover 103 is shown as a single part in FIG. 1, the cover may instead be formed from multiple parts or flaps that collectively cover the ventilation port when the cover is in its closed position.

Figure 2:
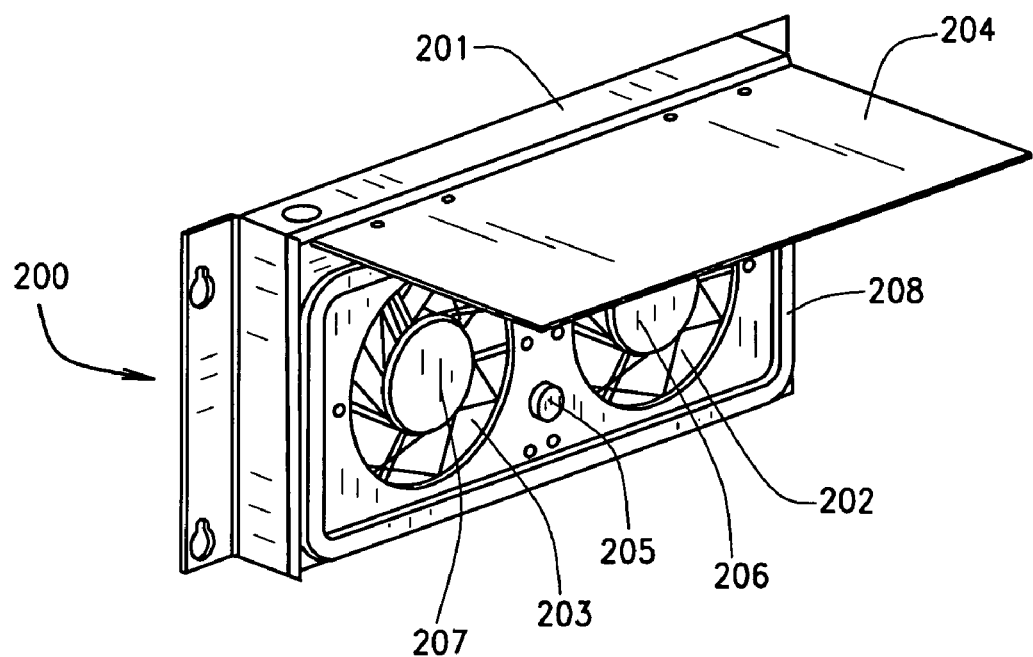
FIG. 2 is a perspective view of a ventilation assembly with a seal and fans according to a second exemplary embodiment of the invention.

FIG. 2 illustrates a ventilation assembly 200 for an electronic equipment enclosure according to another exemplary embodiment of the present invention. As shown in FIG. 2, the ventilation assembly 200 includes a housing 201, two ventilation ports 202 and 203, a cover 204, and an electromagnet 205. The electromagnet is positioned to selectively secure the cover 204 in a closed position with the cover positioned over both ventilation ports 202, 203.

The ventilation assembly 200 also includes fans 206, 207 positioned in the housing 201 for exhausting (typically hot) air from, e.g., an outdoor telecommunications equipment enclosure. Although two fans 206, 207 and two ventilation ports 202, 203 are shown in FIG. 2, it should be understood that additional fans and any number of ventilation ports may be employed as necessary.

In some embodiments, the fans 206, 207 are energized on a mutually exclusive basis with respect to the electromagnet. When the electromagnet is energized, the fans are not energized. When the electromagnet is deenergized, the fans are energized. As should be apparent, however, the fans and electromagnetic may be energized according to any desired scheme without departing from the scope of the present invention. In the embodiment of FIG. 2, the electromagnet is deenergized when the fans are energized to allow the cover 204 to at least partially open due to air pressure generated by the fans.

Although only one cover 204 is shown in the embodiment of FIG. 2, it should be understood that multiple covers can also be employed. For example, each ventilation port 202, 203 can have a separate cover. Additionally, multiple electromagnets may be employed together with multiple covers such that each cover can function independently, providing greater control over the airflow created by the fans 206, 207. Further, each cover may itself comprise multiple parts, as noted above.

With further reference to FIG. 2, the ventilation assembly 200 also includes a seal 208. The seal is preferably compressed by the cover when the electromagnet 205 is energized to attract and hold the cover 204 in its closed position. In this manner, electronics or other equipment within the ventilation assembly 200 (or another enclosure to which the ventilation assembly is attached) is better protected from external elements including excessive temperatures, dust, debris, insects, rodents, etc. The seal 208 is preferably positioned on the cover or the housing in such a manner as to eliminate any gaps between the cover and a portion of the housing surrounding the ventilation ports 202, 203 when the cover is in its closed position. Although only one continuous seal is shown in FIG. 2, multiple seals of any desired type and configuration may be employed in various embodiments of the invention. For example, a separate seal may be provided around each ventilation port shown in FIG. 2.

Figure 3A:
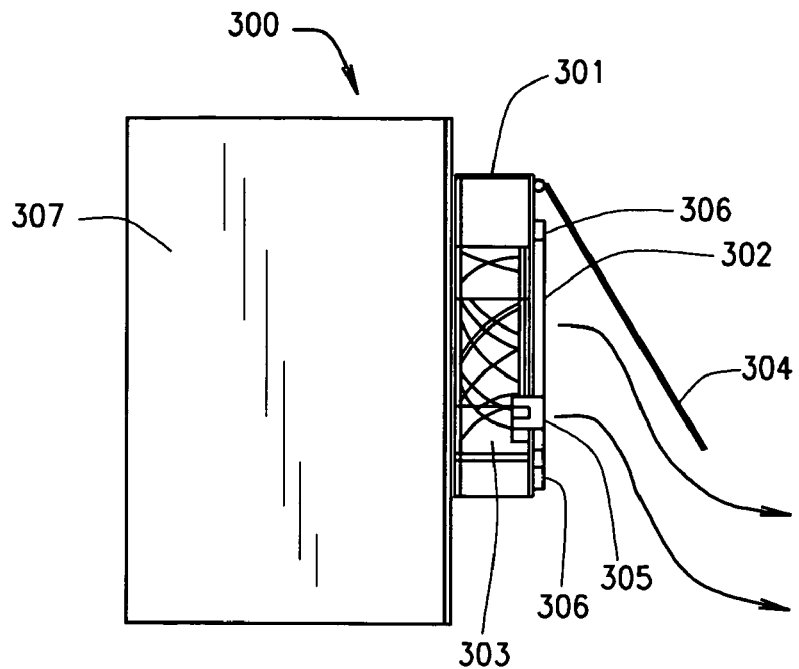
FIG. 3a is a side view of an electronic equipment enclosure with an exhaust port cover in an open position.
Figure 3B:
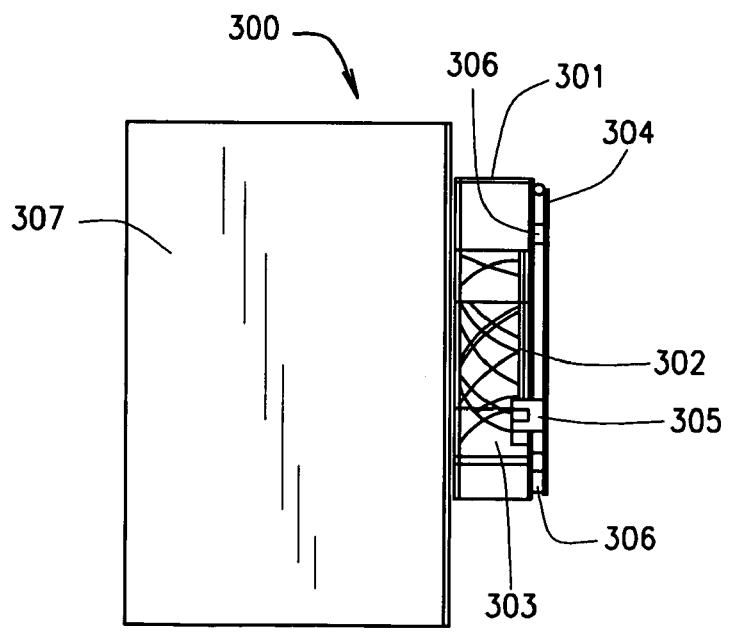
FIG. 3b is a side view of the electronic equipment enclosure of FIG. 3a with the exhaust port cover in a closed position.

An electronic equipment enclosure 300 according to another exemplary embodiment of present invention is illustrated in FIGS. 3a and 3b. The electronic equipment enclosure 300 includes a housing 301, an exhaust port 302, a fan 303, and a cover 304. The cover is moveable between an open position and a closed position. The electronic equipment enclosure also includes an electromagnet 305 for selectively securing the cover in the closed position.

FIG. 3a illustrates the enclosure 300 with the cover 304 in its open position. In this embodiment, the open position is achieved by de-energizing the electromagnet while the fan is energized such that the cover is opened by fan pressure. The extent of movement of the cover between its open and closed positions can be varied as necessary for any given embodiment, and may depend on factors such as the weight of the cover, how the cover is attached to the enclosure housing, the amount of air pressure generated by the fans, etc.

FIG. 3b illustrates the enclosure 300 with the cover 304 in the closed position. The cover is secured in this position by the electromagnet and compresses a seal 306 to isolate equipment within the enclosure from the external environment. In this particular embodiment, the cover is biased toward its closed position by gravity. Therefore, when the fans are deenergized and the electromagnet is energized, the cover moves to its closed position and is then secured in the closed position by the electromagnet. In this particular embedment, the seal 306 is a rubber gasket, although other seal types and materials may be employed.

Although FIGS. 3a and 3b illustrate a ventilation assembly attached to an external surface of an electronic equipment enclosure, the ventilation assembly may instead be integrated into the enclosure (e.g., with the ventilation assembly cover forming an external surface of the enclosure).

The electronic equipment enclosure may also include a controller for energizing the electromagnet and the fan. The controller, not shown, determines which of at least the electromagnet and the fan is energized at any given time. The controller may react to any number of factors particular to an application of the embodiment of the invention. For example, the controller may react to the inside temperature of the electronic equipment enclosure so as to deenergize the electromagnet and energize the fans (e.g., by diverting power from the electromagnet to the fans by means of a relay) when the interior cabinet temperature exceeds a preset temperature.

When describing elements or features of the present invention or embodiments thereof, the articles "a", "an", "the" and "said" are intended to mean there are one or more of such elements or features. The terms "comprising", "including" and "having" are intended to be inclusive and mean there may be additional elements or features beyond those specifically described.

Those skilled in the art will recognize that various changes can be made to the exemplary embodiments and implementations described above without departing from the scope of the present invention. Accordingly, all matter contained in the above description or shown in the accompanying drawings should be interpreted as illustrative and not in a limiting sense.

What is claimed is:

1. An outdoor telecommunications equipment enclosure comprising a housing defining at least one exhaust port; at least one fan positioned in the housing; a cover movable between an open position and a closed position, the cover positioned over the exhaust port when the cover is in the closed position; and at least one electromagnet for selectively securing the cover in the closed position.

2. The equipment enclosure of claim 1 further comprising a controller for energizing one of the electromagnet and the fan when the other of the electromagnet and the fan is de-energized.

3. The equipment enclosure of claim 2 further comprising a seal positioned on one of the housing and the cover, the seal surrounding the exhaust port when the cover is in the closed position.

4. The equipment enclosure of claim 3 wherein the electromagnet is mounted on the housing.

5. The equipment enclosure of claim 4 wherein the fan is adapted to at least partially open the cover when the fan is energized.

6. A method for selectively covering an exhaust port of an outdoor telecommunications equipment enclosure having an electromagnet and an exhaust port cover, the method comprising energizing the electromagnet to secure the exhaust port cover in a closed position with the exhaust port cover positioned over the exhaust port.

7. The method of claim 6 further comprising de-energizing a fan prior to or when energizing the electromagnet.

8. The method of claim 6 further comprising de-energizing the electromagnet to release the exhaust port cover from the closed position.

9. The method of claim 8 further comprising energizing a fan when or after de-energizing the electromagnet.

10. The method of claim 6 further comprising attaching the electromagnet to one of the enclosure and the exhaust port cover.

* * * * *